(12) United States Patent
Arsovski et al.

(10) Patent No.: US 7,823,107 B2
(45) Date of Patent: *Oct. 26, 2010

(54) TRANSITION BALANCING FOR NOISE REDUCTION/DI/DT REDUCTION DURING DESIGN, SYNTHESIS, AND PHYSICAL DESIGN

(75) Inventors: Igor Arsovski, Williston, VT (US); Serafino Bueti, Waterbury, VT (US); Joseph A. Iadanza, Hinesburg, VT (US); Jason M. Norman, Essex Junction, VT (US); Hemen R. Shah, South Burlington, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 433 days.

This patent is subject to a terminal disclaimer.

(21) Appl. No.: 11/875,032

(22) Filed: Oct. 19, 2007

(65) Prior Publication Data

US 2009/0106724 A1   Apr. 23, 2009

(51) Int. Cl.
*G06F 17/50* (2006.01)
*H04L 7/00* (2006.01)

(52) U.S. Cl. .......................... 716/6; 375/354

(58) Field of Classification Search ................ None
See application file for complete search history.

(56) References Cited

U.S. PATENT DOCUMENTS

| | | | |
|---|---|---|---|
| 5,444,407 | A | 8/1995 | Ganapathy et al. |
| 5,646,543 | A | 7/1997 | Rainal |
| 5,768,213 | A | 6/1998 | Jung et al. |
| 6,101,621 | A | 8/2000 | Kondo |
| 6,216,256 | B1 | 4/2001 | Inoue et al. |
| 6,232,905 | B1 | 5/2001 | Smith et al. |
| 6,249,560 | B1 | 6/2001 | Ichihara |
| 6,305,001 | B1 | 10/2001 | Graef |
| 6,307,905 | B1 | 10/2001 | Agazzi |

(Continued)

FOREIGN PATENT DOCUMENTS

EP   0 903 660 A1   3/1999

(Continued)

OTHER PUBLICATIONS

Arsovski et al., U.S. Appl. No. 11/460,065, Office Action Communication, Jun. 23, 2009, 6 pages.

(Continued)

*Primary Examiner*—Leigh Marie Garbowski
(74) *Attorney, Agent, or Firm*—Gibb I.P. Law Firm, LLC; Michael J. LeStrange, Esq.

(57) ABSTRACT

An embodiment of a design structure is shown for noise reduction comprising synthesizing blocks of sequential latches, e.g., a pipeline circuit architecture or clocking domain, which comprises combinational logic, synthesizing a root or a master clock and at least one phase-shifted sub-domain clock for each block, assigning primary inputs and primary outputs of the block to the root clock, assigning non-primary inputs and non-primary outputs of the block to the sub-domain clock, splitting root clock inputs into root clock inputs and phase-shifted sub-domain clock inputs, assigning each of the blocks a different phase-shifted sub-domain clock phase offset, creating a clock generation circuitry for the root clocks and the phase-shifted sub-domain clocks.

20 Claims, 13 Drawing Sheets

U.S. PATENT DOCUMENTS

| | | |
|---|---|---|
| 6,459,621 B1 | 10/2002 | Kawahara et al. |
| 6,463,005 B2 | 10/2002 | Maeda |
| 6,466,066 B1 | 10/2002 | Yoshikawa |
| 6,536,024 B1 * | 3/2003 | Hathaway ................ 716/6 |
| 6,711,724 B2 | 3/2004 | Yoshikawa |
| 6,906,554 B1 | 6/2005 | Chen |
| 6,907,538 B1 | 6/2005 | Boutaud |
| 6,910,145 B2 | 6/2005 | MacLellan et al. |
| 6,946,870 B1 | 9/2005 | Lesea |

OTHER PUBLICATIONS

Plosila, et al., "Pipelined On-Chip Bus Architecture With Distributed Self-Timed Control," IEEE, 2003, pp. 257-260.

* cited by examiner

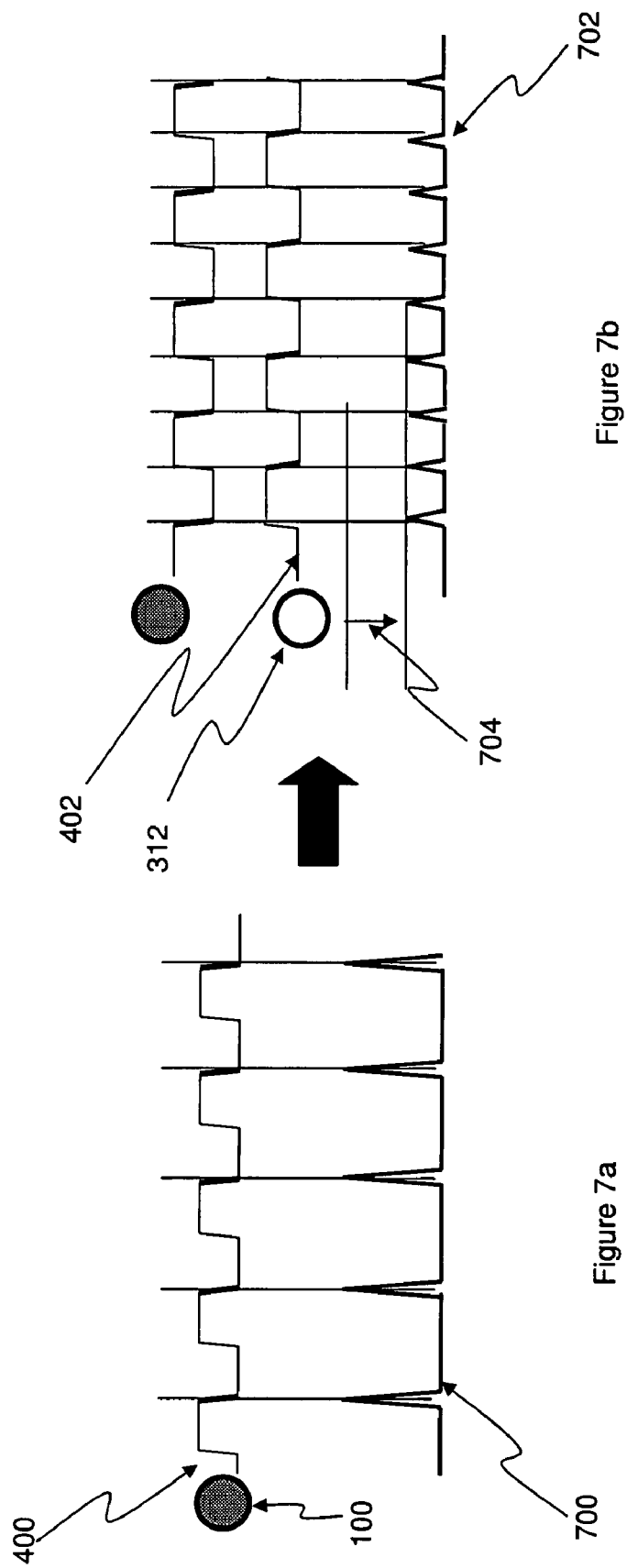

TRANSITION BALANCING FOR NOISE REDUCTION/DI/DT REDUCTION DURING DESIGN, SYNTHESIS, AND PHYSICAL DESIGN

CROSS-REFERENCE TO RELATED APPLICATIONS

This application is related to U.S. application Ser. No. 11/460,065 filed Jul. 26, 2006, the complete disclosure of which, in its entirety, is herein incorporated by reference.

BACKGROUND

1. Field of the Invention

The embodiments of the invention generally relate to noise reduction, and, more particularly, to methods for synthesis of low-noise pipelined designs.

2. Description of the Related Art

Chips manufactured today are getting larger and continue to demand increased performance of the system. The increase in chip size is driven by the need to integrate an entire system-on-chip (SoC). SoC design minimizes chip-to-chip communication and thus generally improves overall performance. Such integrated designs place noise-producing digital circuits next to noise-sensitive analog circuits and introduce new challenges of designing low-noise digital circuits and noise-immune analog circuits.

A large contributor to the overall chip noise is the clock signaling of latches, and the subsequent signal propagation in the logic that follows each latch. Typically all latches are clocked at the same time. The current demand from the supply spikes at the beginning of each clock signal cycle introducing the highest supply and substrate noise. The noise problem is compounded by aggressively pipelined designs, which not only increase the signal frequency, but also the number of latches that need to be clocked.

In pipelined designs, these latches are placed at equal intervals, bounding maximum combinational logic that could be traversed by a propagating signal during a single clock signal cycle. Pipelined designs divide the critical path of a specific design into smaller clocking domains and smaller clock signal allocations across the chip. This approach maintains equal propagation delays in all stages of the pipeline but also concentrates most of the clocking current demand at one clock signal edge. A method for spreading the current demand over the entire clock signal cycle would significantly improve the peak noise levels on chip.

U.S. Pat. No. 6,463,005 B2, incorporated herein by reference, teaches the method of noise reduction by staggering the switching of the (largely capacitive) column lines in an (memory) array. U.S. Pat. No. 5,646,543, incorporated herein by reference, reduces inductive noise by staggering the activation of off-chip drivers. U.S. Pat. No. 6,711,724, incorporated herein by reference, teaches pipeline based circuits with a clock signaling mechanism.

SUMMARY

The embodiments disclosed herein describe a methodology for reducing noise associated with clocking of latches in pipelined designs. By dividing a chip into clocking domains, and clocking each domain with a same-frequency phase-shifted clock signal, the overall peak noise value associated with clocking of latches is averaged across the clock signal cycle, resulting in a significantly lower peak noise value. An interface between clocking domains synchronizes all clock signal domains allowing for a cycle time and latency equal to that of the conventional pipelined design. A synthesis methodology used to implement this variable-length pipeline is described. It is understood that the term clock can be used when referring to the clock signal herein described.

A method for noise reduction disclosed herein comprises synthesizing blocks of sequential latches, e.g., a pipeline circuit architecture or clocking domain, synthesizing a root or a master clock signal and a phase-shifted sub-domain clock signal assigned to each of the blocks, assigning primary inputs and primary outputs of a block to the root clock signal, assigning non-primary inputs and non-primary outputs of the block to the phase-shifted sub-domain clock signal, splitting root clock signal inputs into root clock signal inputs and phase-shifted sub-domain clock signal inputs, assigning each of the blocks a different phase-shifted sub-domain clock signal phase offset, creating a clock signal generation circuitry for the root clock signals and the phase-shifted sub-domain clock signals. Those skilled in the art would understand that the use of the term phase-shifted sub-domain clock, sub-domain clock or clocked subdomain may be used interchangeably herein.

In view of the foregoing, an embodiment of the invention provides a signal generation circuitry for the root clock signals and the phase-shifted sub-domain clock signals. The clock signal generation circuitry is set to provide a phase off-set between the root clock signal and each of the phase-shifted sub-domain clock signals.

Another embodiment of the invention provides for the sequential latches of the invention to comprise boundary latches and internal latches. The boundary latches mark the ends of a pipeline structure and are clocked by the root or master clock signal. The internal latches are found between the boundary latches in the pipeline architecture of the circuitry and are clocked by one or more phase-shifted sub-domain clock signals. The internal latches further comprise non-primary inputs and outputs which connect to the phase-shifted sub-domain clock signal or clock signals. The boundary latches comprise primary inputs and primary outputs which run to the master or root clock signal. The master or root clock signal controls the boundary latches while the phase-shifted sub-domain clock signals control the internal latches.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 7 is a schematic illustrating noise reduction.

DETAILED DESCRIPTION OF PREFERRED EMBODIMENTS

Figure 1A:
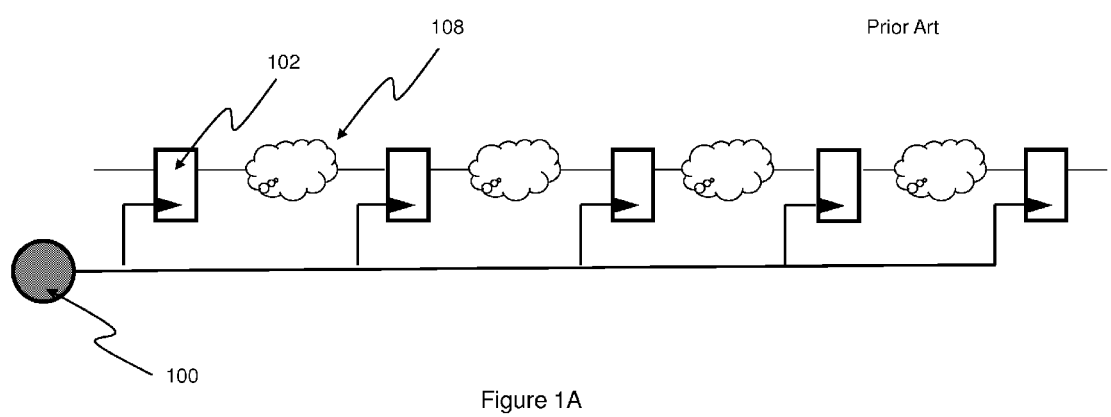
FIG. 1A-B illustrates a schematic diagram of a conventional pipeline design and clocking phases.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for reducing noise in logic circuitry due to the clocking of latches in pipeline circuitry design. The embodiments of the invention achieve this by providing a method by which noise associated with clock signal latching is spread out over time to reduce peak noise levels associated with the clocking of each latch. This reduced noise is achieved by providing for multiple clock signals controlling the clocking of the latches in the series of sequential latches. Referring now to the drawings, and more particularly to FIGS. 1 through 9, where similar reference characters denote corresponding features consistently throughout the figures, there are shown preferred embodiments of the invention.

Figure 1B:
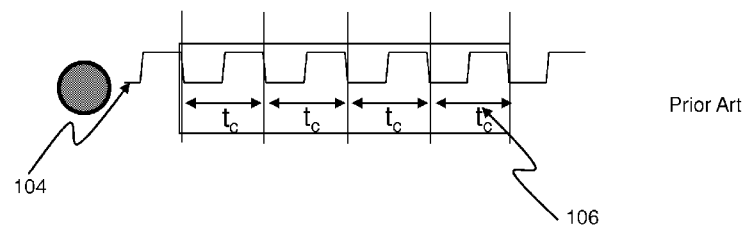

FIG. 1 illustrates a diagram of conventional pipeline designs controlled by a single clock signal. It will be understood to those of skill in the art that the clock signaling boundary latches in other embodiments of the invention may be referred to as a root clock signal or a master clock signal. In FIG. 1A, the clock (100) signals to each falling edge triggered latch (102) in the pipeline which in turn launches and captures data propagating through the combinational logic (108) of each pipeline stage. FIG. 1B illustrates the phase (104) of the clock signal controlling the pipeline and time (106) between leading edges of the clock signal cycle. The Tc in the figure shows a cycle that starts with the clock signal low. If latches (102) were rising edge triggered, the cycle would start with the rising edge.

Figure 2:
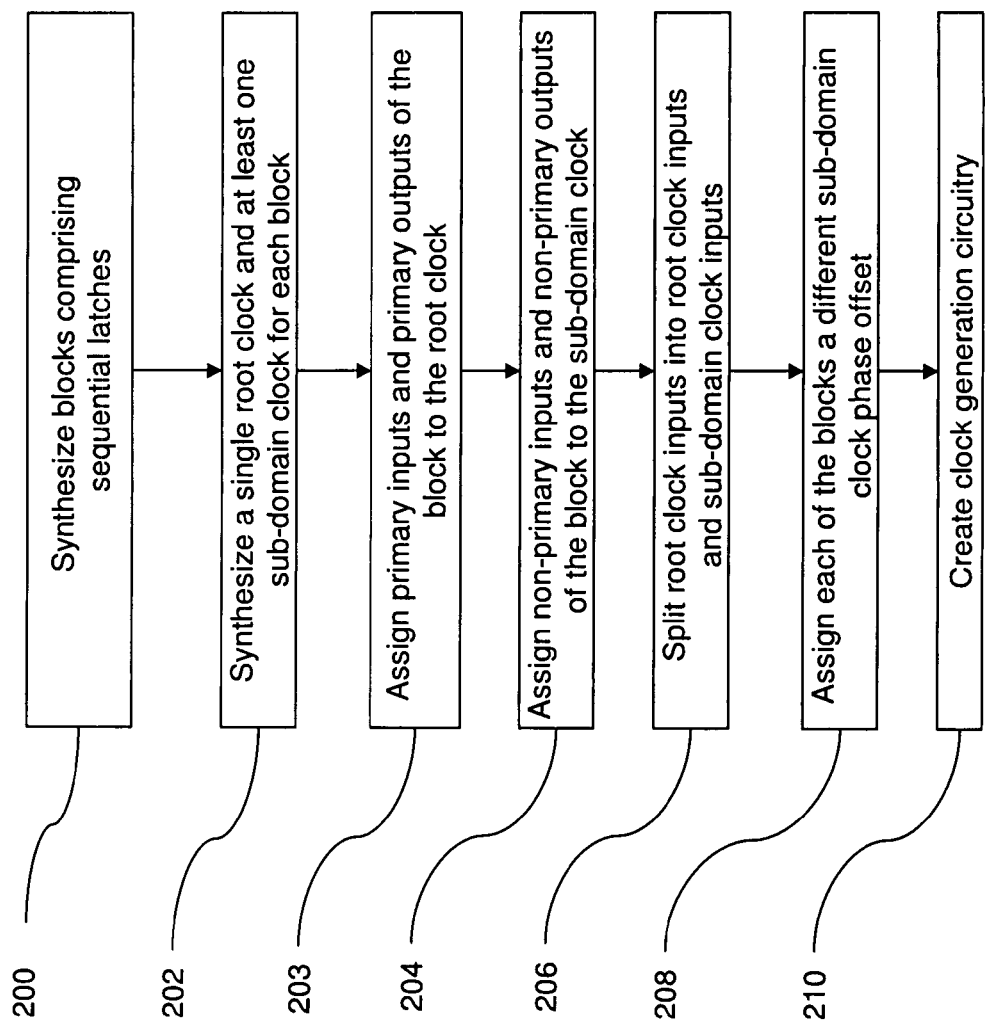
FIG. 2 is a flow diagram illustrating a preferred method of an embodiment of the invention.

FIG. 2 illustrates a flow diagram according to an embodiment of the invention of a method for noise reduction. The method comprises synthesizing blocks comprising sequential latches (200); synthesizing a single root clock signal and at least one phase-shifted sub-domain clock signal for each block (202); assigning primary inputs and primary outputs of the block to said root clock signal (203); assigning non-primary inputs and non-primary outputs of the block to the phase-shifted sub-domain clock signal (204); splitting root clock signal inputs into root clock signal inputs and phase-shifted sub-domain clock signal inputs (206); assigning each of the blocks a different phase-shifted sub-domain clock signal phase offset (208); creating a clock signal generation circuitry for the root clock signals and the phase-shifted sub-domain clock signals (210).

Figure 3:
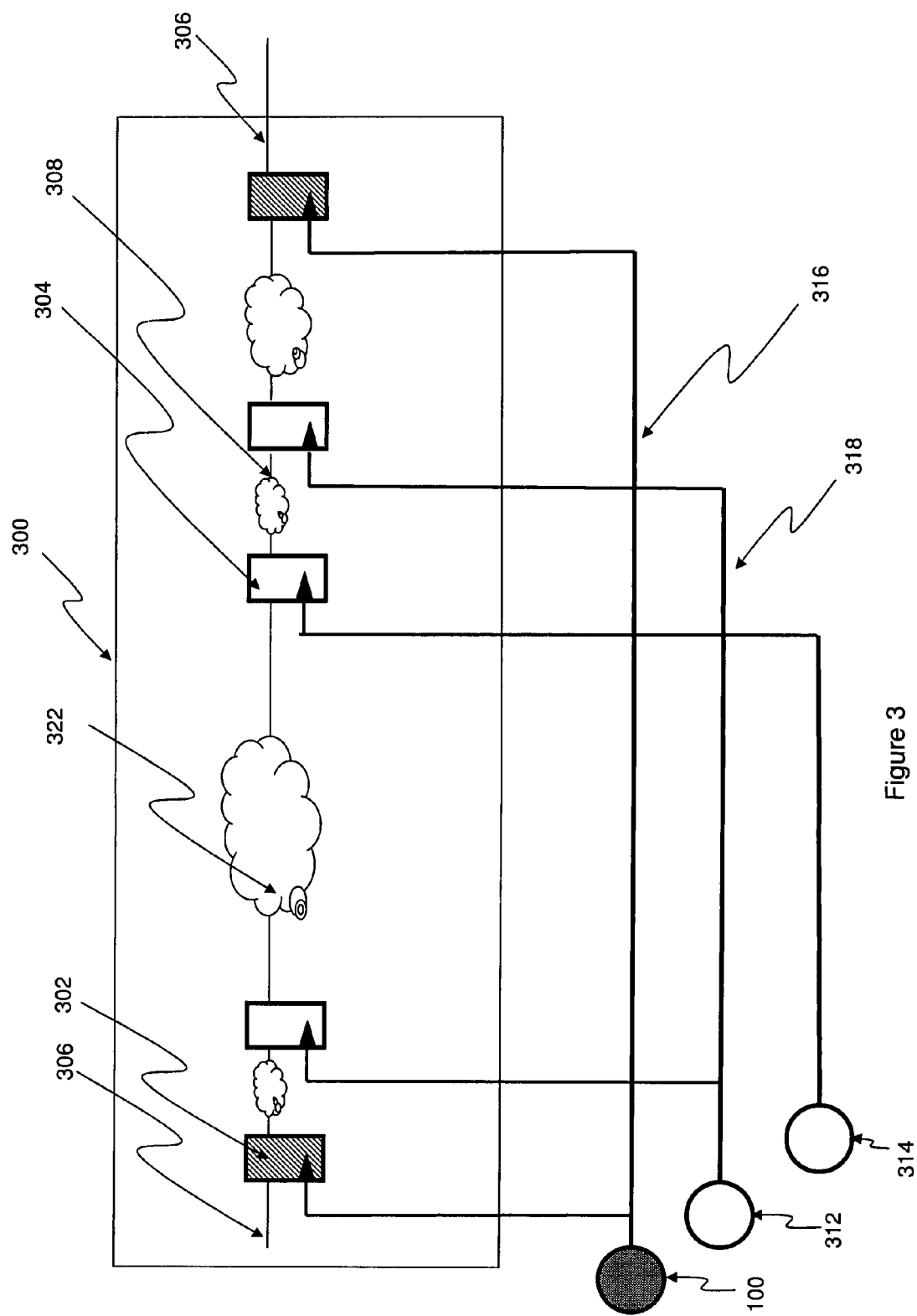
FIG. 3 is a schematic illustrating an asymmetric pipeline design.

FIG. 3 shows a schematic of the pipeline design of an embodiment of the invention comprising blocks (300) which comprise sequential elements, e.g. latches (302), (304); a root clock signal, e.g., master clock signal (100) and a phase-shifted sub-domain clock signal (312); primary inputs and primary outputs of the block assigned to the root clock signal (306); non-primary inputs and non-primary outputs of the block assigned to the phase-shifted sub-domain clock signal (308); and combinational logic of various delays (322). Item (314) depicts an embodiment of the invention where more than one phase-shifted sub-domain clock signals are used in the method.

Figure 4:
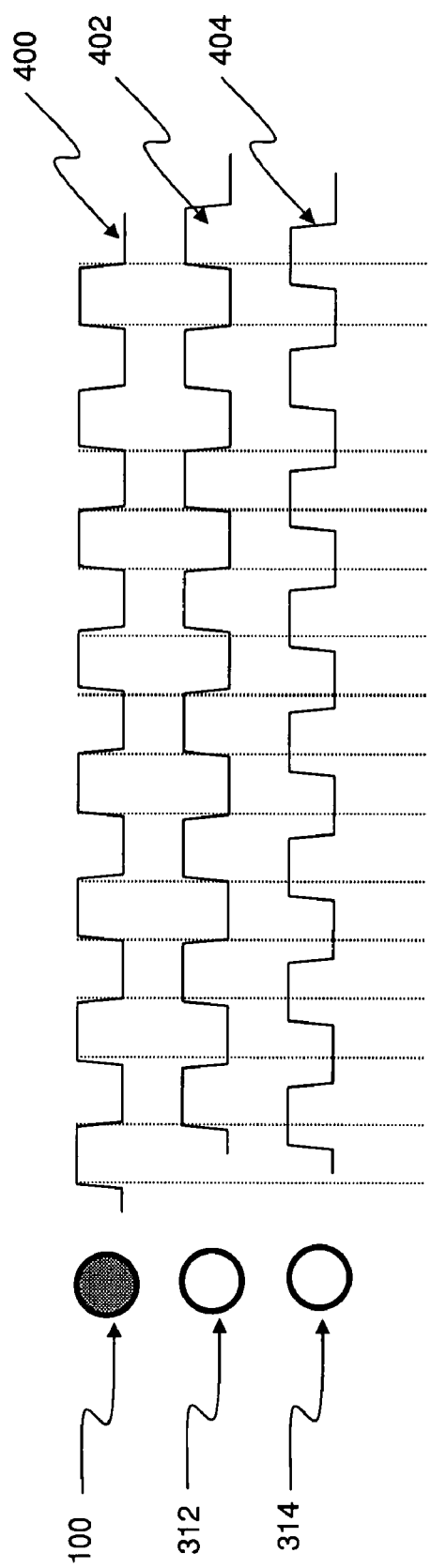
FIG. 4 is a schematic illustrating clock signal phases.

FIG. 4, further shows the block comprising different phase-shifted sub-domain clock signal offsets (402), (404) when the clock signaling cycles of each clock signal, e.g. master or root clock signal (400) and each phase-shifted sub-domain clock signal (402), (404), are compared with the other. The invention also comprises clock signal distribution circuitry for said root clock signals and said phase-shifted sub-domain clock signals, as shown in FIG. 3, items (316), (318). One of skill in the art would understand that items (100) and (316), taken alone, represent the clock signal distribution circuitry of master clock from the clock source to the boundary latches. Item (316) may include phase locked loops (PLLs) or other clock generation functions, clock tree buffering and the final stage of wiring to the boundary latches. In a similar fashion, items (312) and (318) represent the clock signal distribution circuitry of an exemplary phase shifted sub-domain clock. Further, one of skill in the art would recognize that clock generation functions such as PLLs incorporated into (316) may be also be used to generate phase-shifted sub-domain clocks for (318).

In another embodiment of the invention, the sequential latches of the blocks comprise boundary latches (302), which mark the boundaries of said blocks or pipelines, and internal latches (304) which are bound by the boundary latches. The internal latches comprise non-primary inputs and non-primary outputs (308) and the boundary latches comprise primary inputs and primary outputs (306). The boundary latches (302) are clocked by the root clock signal (100). Whereas, the internal latches (304) are clocked by a phase-shifted sub-domain clock signal (312), (314).

Figure 5:
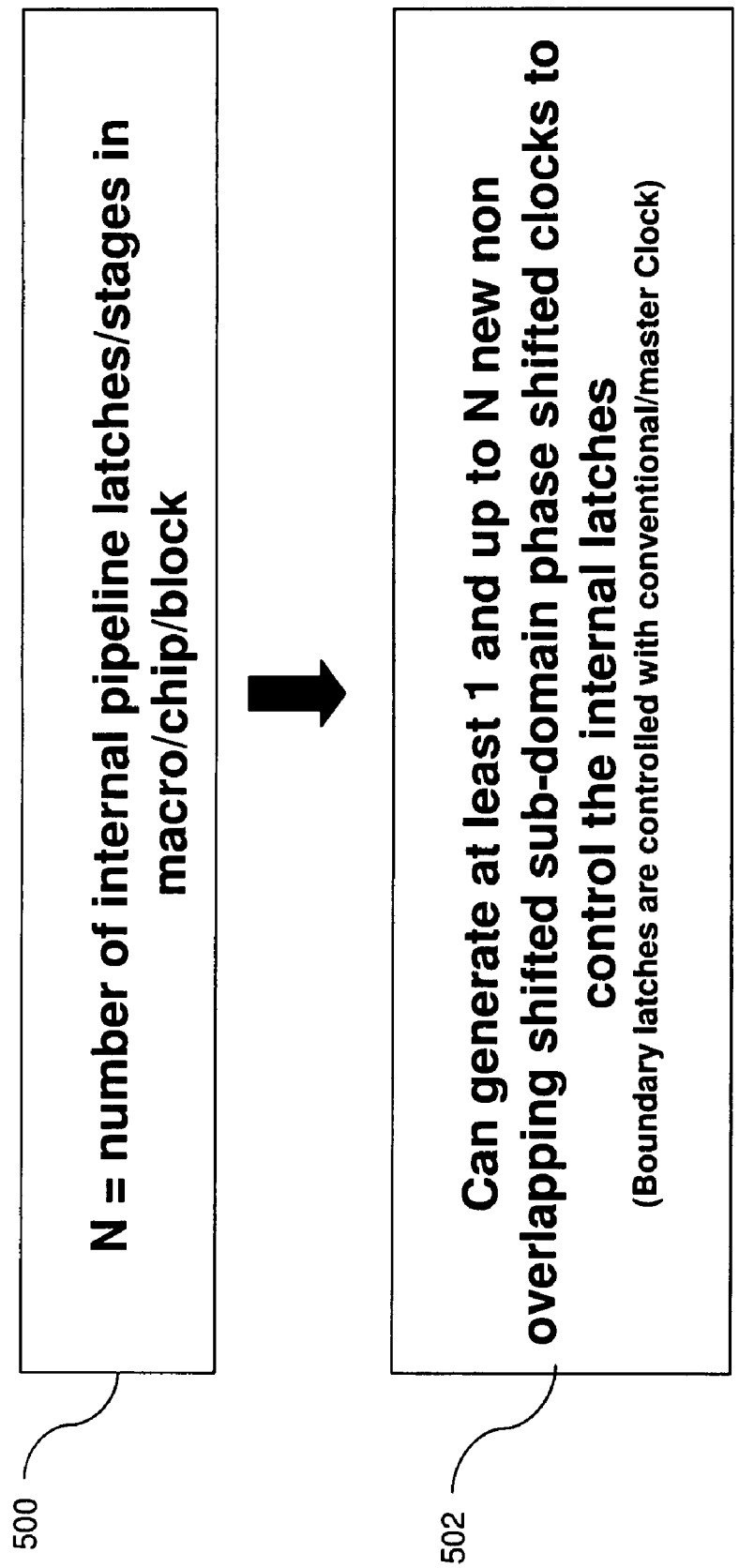
FIG. 5 is flow diagram illustrating a method of an embodiment of the invention.

FIG. 5 is a flow diagram illustrating the maximum number of subdomain clocking mechanisms that can be used in the present invention to achieve noise spreading. The embodiment of the invention disclosed by FIG. 5 exemplifies that the number of clock subdomains of the invention are variable. In other words, there is at least one subdomain clock signal for each block or subdomain of the invention, as previously discussed. The number of subdomain clock signal varies from at least 1 subdomain clock signal to a maximum number as is shown in FIG. 5. This maximum number of subdomain clock signals can be determined by calculating the number of pipeline stages in a block (e.g., macro, chip) which is represented by "N" (500). Therefore, there can be as many subdomain clock signals as there are latches in the macro or subdomain. The new non-overlapping subdomain clock signals are synthesized to clock the internal latches, the boundary latches are clocked by the master/root clock signal (502). The new non-overlapping phase-shifted sub-domain clock signals can be selected, as known by those of skill in the art, to partition the pipelines of the design for intermediate results, timing, etc.

Figure 6A:
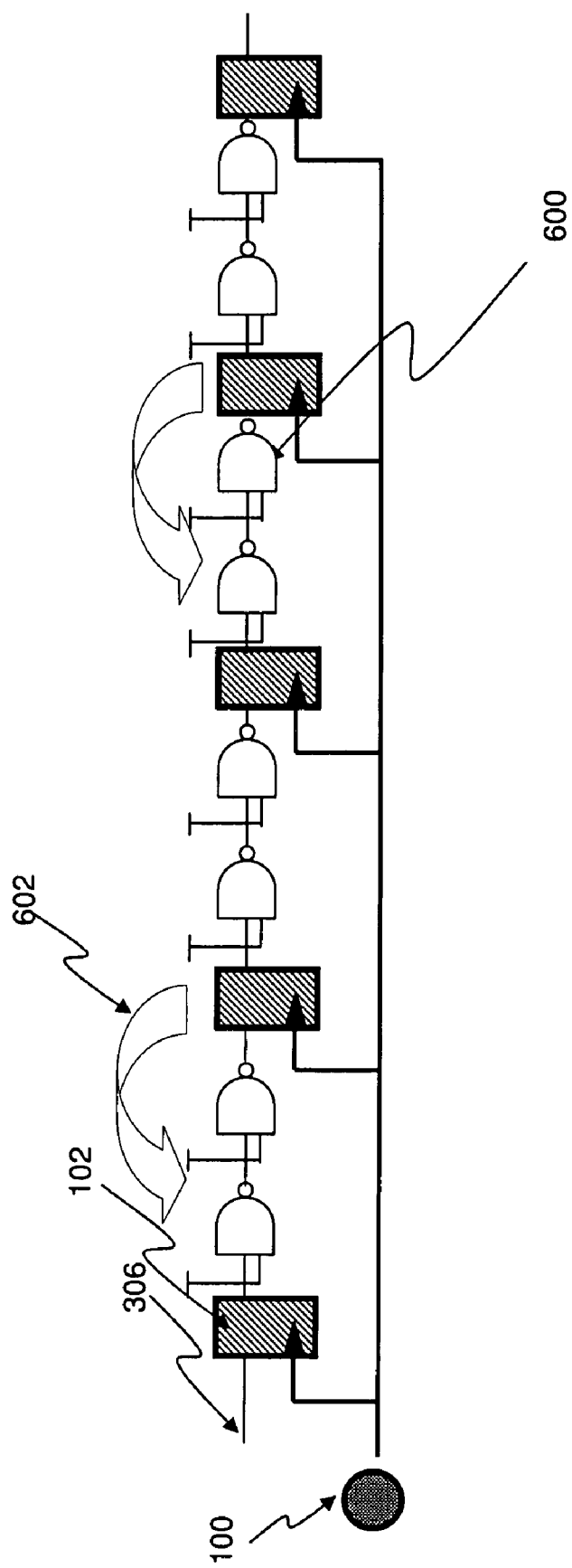
FIGS. 6*a* and 6*b* are schematics of a variable pipeline length design.

FIG. 6 is a diagram showing yet another embodiment of the invention and implementation of the method to variable pipeline length designs (VPL). In contrast to conventional pipelining, VPL divides logic into variable length portions, and clock signals each stage with a different phase clock signal, the root or master clock signal (100) and the sub-domain clock signal. To convert conventional to a variable pipeline length design (FIG. 6a), the internal latches are slid across combinational logic (602) selected by those of skill in the art and then clocked with phase-shifted clock signals. Item (600) represents the unit delay through the combination of logic and illustrates the repositioning of the latches. VPL methodology shifts logic from one pipeline stage to another and accommodates for increases or decreases in propagation delay in each stage by clocking different pipeline stages with appropriately phase-shifted clock signals.

Figure 6B:
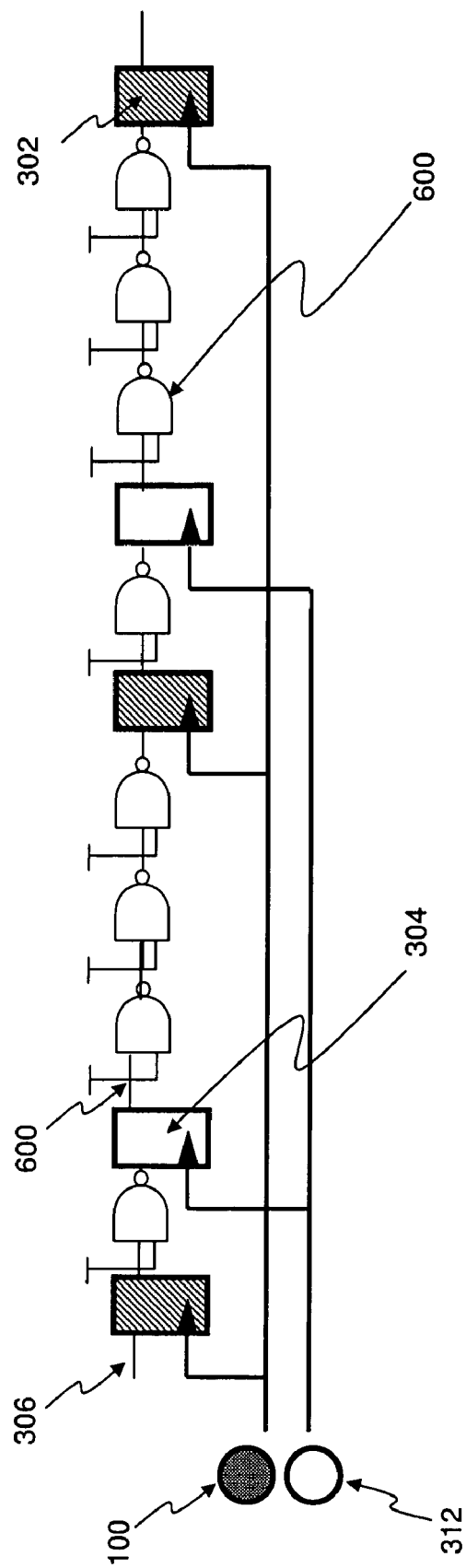

FIG. 6b shows the embodiment of the present invention where the boundary latches (302) are controlled by a root or master clock and the internal latches (304) are controlled by at least one phase-shifted subdomain clock. Even though there is a shifting of logic (602) in the pipeline stages, the function and logic stays the same at the boundaries. Item (604) shows, merely by way of example where the latch would have been in a convention pipeline designs depicted in FIG. 6a. In FIG. 6b, the combinational logic has been moved to the other side of latches 304 in this figure when compared to FIG. 6a. The launching and capturing of boundary latches is maintained even though the logic of the internal latches has been shifted. Thus, data propagates through the same amount of logic in a same amount of time, but it is launched and latched based on the phase shift of the phase-shifted subdomain clock signals during each stage. Synthesis will be used to guarantee function of the block at the primary input and primary output boundary latches regardless of internal latch shifting. Thus, VPL spreads noise by scheduling non-overlapping clocking of latches.

FIGS. 7a and 7b illustrate the noise reduction resulting from controlling pipelined latches with multiple clock signals having phase offsets. Each clock has an active edge which is used to launch data from the clocked latches and start the propagation through the combinational logic. In these figures, the falling edge is designated as the active edge. In FIG. 7a, the clock signal noise in a conventional clock design is shown. FIG. 7b shows the noise reduction evident in the method of the present invention. When the master clock signal (100) is switching to produce its active edge, at least one phase-shifted sub-domain clock signal (312) is not switching to produce its active edge. When the master clock signal is not switching to produce active edge, at least one phase-shifted sub-domain clock signal is switching to produce its active edge. Therefore, the leading edges of each of the master clock signal cycle (400) and the leading edge of the sub-domain clock signal cycle (402) are off-phase. With only a single master clock signal in control of the clocking of the pipeline latches, high peaks of noise are produced with each cycle (700). However, with multiple clock signals controlling the latches in the pipeline, less instantaneous current is drawn to propagate each clock signal cycle and thus less noise is produced (702) at each given clock signal cycle. By clocking latches with a different phase clock signal the peak noise power is spread over the cycle. As illustrated, systems with two phases show noise levels halved as compared to systems with just one phase. Thus, using N different phase-shifted clock signals reduces the peak clocking noise by N times. Item (704) illustrates the change in noise in systems having only a master clock signal and systems having a master clock signal and at least one sub domain clock signal. Therefore, the noise level is spread out over time in the pipeline circuitry.

Figure 8:
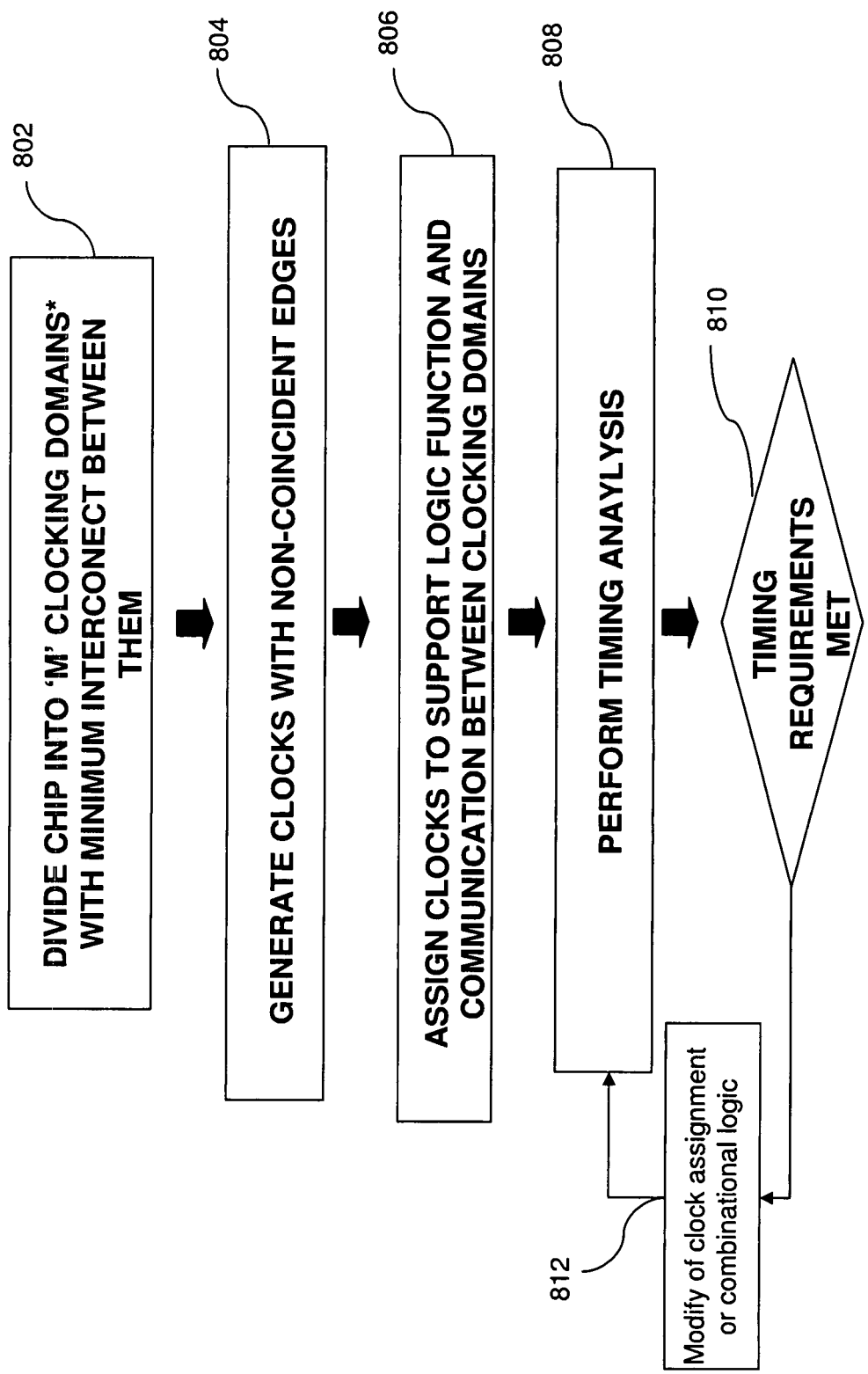
FIG. 8 is a flow diagram illustrating an embodiment of the present method.

In another embodiment of the invention, chip-level clocking-domain division further improves noise spreading illustrated by the flow diagram of FIG. 8. The chip is divided into 'M' clocking domains with minimum interconnect between them (802). A master clock +$\Sigma N_m$ sub-domain clock signals with non-coincident edges are generated (804) where for each of the M blocks in the summation, N is at least 1 and may be as large as the number of non-boundary pipeline stages in each of the 1 through Mth block. The assignment of N for any of the M clocking domains may be independent of N assignment for any other of the M clocking domains. One of skill in the art would recognize that the present invention may be practiced with only one phase-shifted sub-domain clock or as many sub-domain clocks as there are stages in the block/sub-domain. Clock signals are assigned to the clocking domains to support logic function and communicate between clocking domains (806). Timing analysis (808) is performed to determine if timing requirements are met (810). Should the IC design fail to meet timing requirements, modification of clock assignments or re-synthesis or repowering of combinational logic is performed (812) to improve integrated circuit chip (IC) timing and the process returns to timing analysis (808)

To increase the noise spreading, each clocking domain should have a nearly equal number of latches. One of skill in the art would recognize that within the macro or chip, there may be blocks/sub-domains that do not have the phase-shifted sub-domain clocks of the invention and may have other clocking designs or mechanisms as are known to those knowledgeable in the art.

Figure 9:
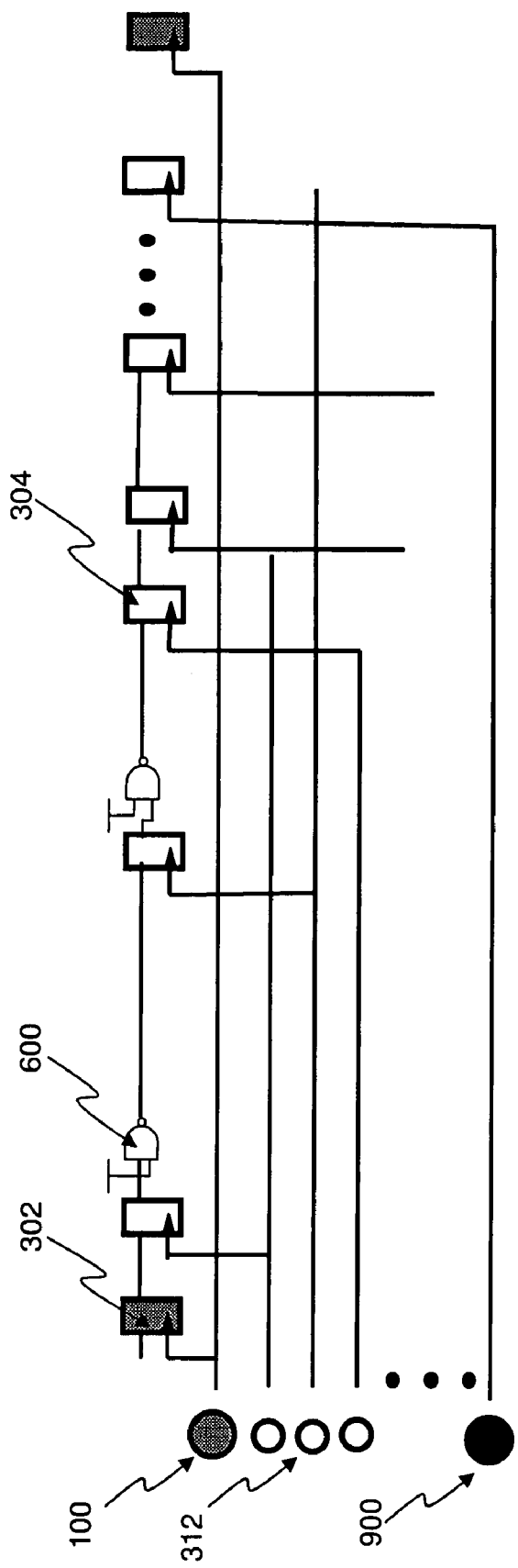
FIG. 9 is a schematic illustrating an N-stage pipeline design.

FIG. 9 illustrates an $1+N_m$-phase clocking domain using the VPL method. The structure of the pipeline latches are similar to the structure shown in FIG. 6. However, instead of a two clock signal, i.e. two phase system, a $1+N_m$ phase system is illustrated having 1 master clock signal and N phase shifted sub-domain clock signals (900) is provided for a Q-stage pipeline. For the purposes of FIG. 9, and in general, left most boundary latch (302) would constitute a first stage and right-most boundary latch constitutes the Nth stage; thus, the number of sub-domain clocks to make all intermediate stages in a Q-stage pipeline uniquely clocked is N=Q-2. The N non-overlapping clock signals control the intermediate latches. Clock signal external (chip/macro) latches (302), are clocked with conventional clock signal, e.g., master or root clock signal, (100). Internal latches (304) are clocked with a combination of newly generated sub-domain clock signals (312), (900). Moreover, those of skill in the art would readily recognize that if fewer clock signals were used in such a design then some latches would share a sub-domain.

Figure 10:
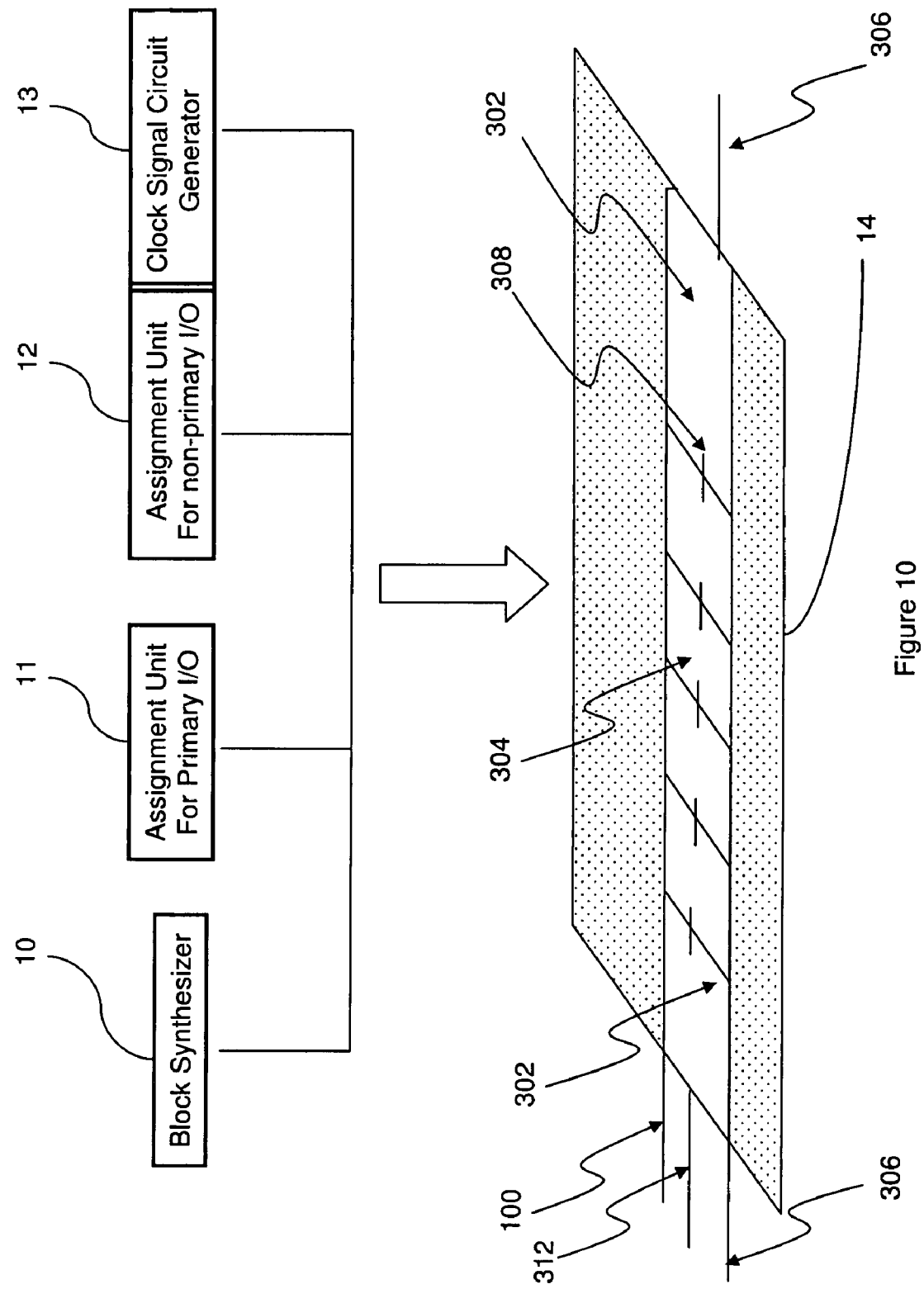
FIG. 10 is a schematic illustrating of the system of reducing noise in electrical circuits.

FIG. 10 is a schematic representation of the system of reducing noise in electrical circuits comprising a block synthesizer (10), an assignment unit for primary inputs and outputs (11), an assignment unit for non-primary inputs and outputs (12) and a clock signal generator (13) for making a block of an electrical circuit (14). The block generated by the system is shown to comprise primary inputs and outputs (306), non-primary inputs and outputs (308) root clock signal (100), sub-domain clock signal (312), boundary latches (302) and internal latches (304), which also comprise the combinational logic of the block.

Figure 11:
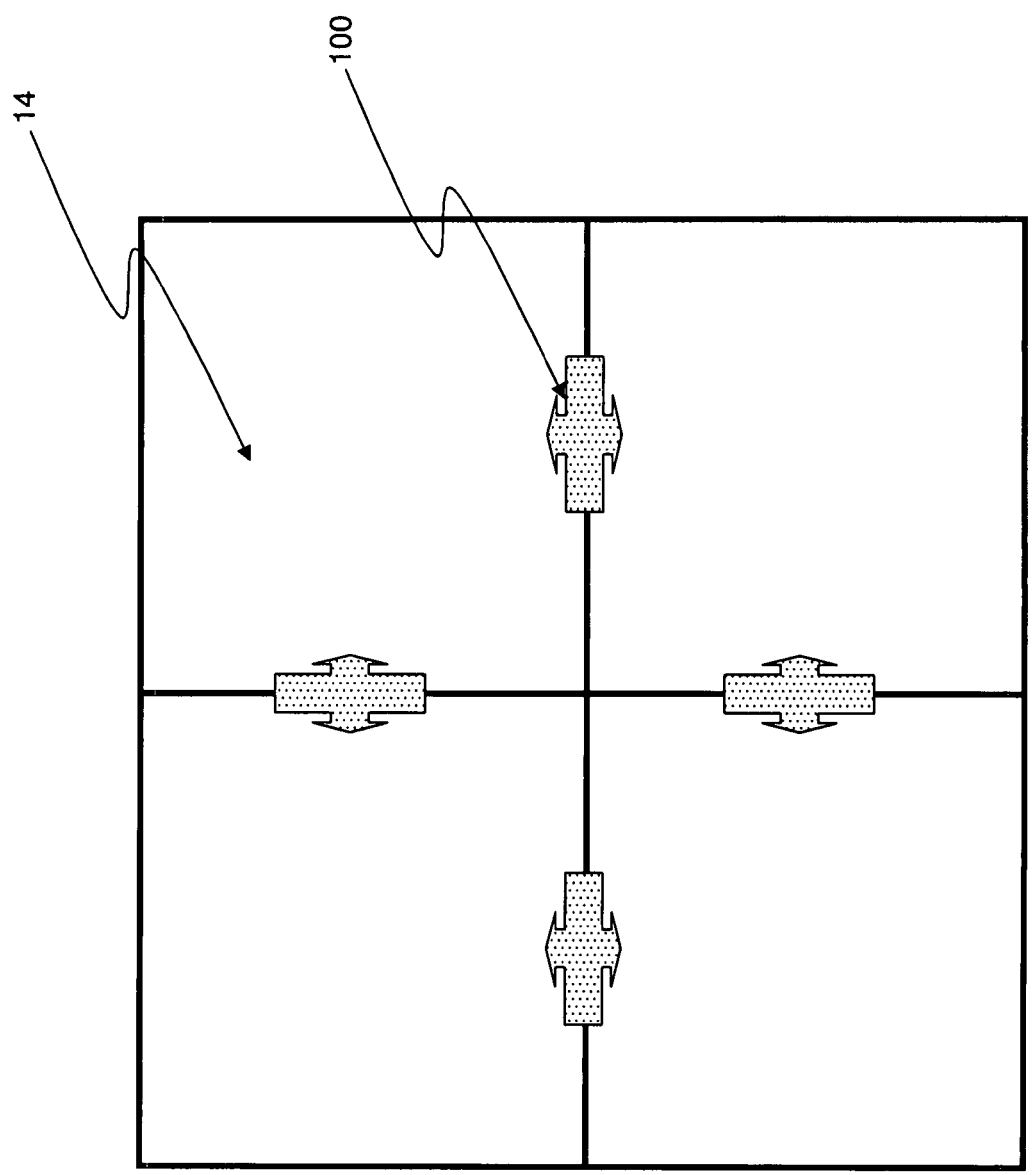
FIG. 11 is a schematic illustrating the blocks or clocking domains on a chip.

FIG. 11 is a schematic illustrating the blocks or clocking domains on a chip. Item 14 represents a block of an electrical circuit. Root clock signal (100) is shown controlling the inter-block communication of the electrical circuit.

More particularly, sequential systems, including finite state machines and data pipelines, may be described, simulated and synthesized into manufacturable designs with the aid of a high level logic description language such as Verilog or Very High Speed Integrated Circuit Hardware Description Language (VHDL). Although nuances exist from designer to designer in how a sequential system may be described, synthesizable constructs within each high level language must be followed.

Within Verilog, a typical sequential logic block description may be formatted as:

```
MODULE SEQLOGIC(reg7,clocksig datain);
OUTPUT [n:0] reg7
INPUT clocksig, [n:0] datain
REG [n:0] reg1, reg2, reg3, reg4, reg5, reg6, reg7
WIRE[n:0] combfunc1, combfunc2, combfunc3, combfunc4,
combfunc5, combfunc6,
combfunc1 = {Combinational logic function of registers 1 through 7}
combfunc2 = {Combinational logic function of registers 1 through 7}
combfunc3 = {Combinational logic function of registers 1 through 7}
combfunc4 = {Combinational logic function of registers 1 through 7}
combfunc5 = {Combinational logic function of registers 1 through 7}
combfunc6 = {Combinational logic function of registers 1 through 7}
ALWAYS @(POSEDGE clocksig)
BEGIN
    reg1 = datain
    reg2 = combfunc1
    reg3 = combfunc2
    reg4 = combfunc3
    reg5 = combfunc4
    reg6 = combfunc5
    reg7 = combfunc6
END
ENDMODULE
```

In a similar fashion, sequential logic blocks within VHDL are formatted as:

```
ENTITY SEQLOGIC IS
    PORT (datain : std_logic_vector
        clocksig : std_logic
        reg7: std_logic vector);
END SEQLOGIC;
ARCHITECTURE EXAMPLE of SEQLOGIC IS
    SIGNAL combfunc1, combfunc2, combfunc3, combfunc4,
combfunc5, combfunc6 : std_logic_vector
BEGIN
PROCESS
BEGIN
    combfunc1 <= {Combinational logic function of registers 1 through 7}
    combfunc2 <= {Combinational logic function of registers 1 through 7}
    combfunc3 <= {Combinational logic function of registers 1 through 7}
    combfunc4 <= {Combinational logic function of registers 1 through 7}
    combfunc5 <= {Combinational logic function of registers 1 through 7}
    combfunc6 <= {Combinational logic function of registers 1 through 7}
    IF clocksig'EVENT AND clocksig= '1' THEN
        reg1 = datain
        reg2 = combfunc1
        reg3 = combfunc2
        reg4 = combfunc3
        reg5 = combfunc4
        reg6 = combfunc5
        reg7 = combfunc6
    END IF;
    WAIT ON clocksig;
END PROCESS
```

Logic blocks to be targeted for synthesis-driven generation of clock sub-domains are coded using Verilog or VHDL. However, high level language extensions, are used to define clock signal sub-domains to be used during synthesis. Examples of excerpts of Verilog and VHDL with language extensions are shown below:

```
Verilog With Clock Sub-Domain Extensions
    MODULE SEQLOGIC(reg7,clocksig datain);
        OUTPUT [n:0] reg7
        INPUT clocksig, [n:0] datain
        REG [n:0] reg1, reg2, reg3, reg4, reg5, reg6
        WIRE[n:0] combfunc1, combfunc2, combfunc3,
        combfunc4, combfunc5, combfunc6
        CLKPARTITION clocksig, clocksig_0_30
        ........
VHDL With Clock Sub-Domain Extensions
ARCHITECTURE EXAMPLE of SEQLOGIC IS
    SIGNAL combfunc1, combfunc2, combfunc3, combfunc4,
combfunc5, combfunc6 : std_logic_vector
    CLKPARTITION clocksig, clocksig_0_30
    BEGIN
    PROCESS
    BEGIN
        combfunc1 <= {Combinational logic function of registers 1 through 7}
        ..........
```

The CLKPARTITION language extension supplies several additional pieces of information to downstream synthesis flows. First, the CLKPARTITION statement itself identifies the logic module or architecture block as a target for clock signal domain partitioning. Arguments following the CLKPARTITION are defined as follows:

CLKPARTITION arg1, arg2

Arg1 defines the root clock signal for sub-domain partitioning as well as the final clock signal phase to use at the logic block's input and output register stages arg2 defines the first clock sub-domain. Its name is a concatenation of three fields;arg2sub1_arg2sub2_arg2sub3, each imparting information to the synthesis tool on desired clock sub-domain definition. Field arg2sub1 defines the parent clock and phase for the clock sub-domain. Field arg2sub2 defines the number of whole-cycle delays experienced by data traveling from the previous launch register to the capture register. A field of _0 indicates that the combinational delay between the two registers is less than 1 clock cycle. A field of_1 indicates that the combinational delay between the launch and capture register is greater than one cycle but less than two cycles, such that data launched by clock edge 0 will be captured by clock edge 2. Field of arg2sub3 defines the within-cycle offset of the sub-domain clock. A code of _30 will place the active edge of the sub-domain clock 30% of the period from the active edge of the master.

The CLKPARTITION statement acts as an additional clock assertion within synthesis, defining a new clock domain and its relationship to a clock defined within the primary assertion file input to synthesis. Synthesis is instructed to form two clock phases from the clocksig root; a master phase (0 offset) and a clock phase delayed 30% of the clock cycle time (clocksig_0_30).

During behavioral simulation of encoded blocks, the CLKPARTITION statement is ignored and the block is simulated as though it has a single phase clock. Making the CLKPARTITION function transparent to the logic designer simplifies logic design and increases usability of the function.

In block synthesis, the high level design is altered with the use of the CLKPARTITION language extension at a block level. A block or unit of high level logic description to be synthesized is read into synthesis to determine if the CLKPARTITION statement exists within the block. If a CLKPARTITION statement does not exist, a single, non-sub-domained clock is assumed and the block is synthesized in a known fashion. If a CLKPARTITION statement is found, it is read, and using the clock period target input into synthesis, the absolute timing relationship between the root clock and sub-domain clock is determined.

In the first step, the block is synthesized (200) using methods known to those in the art, however, the root clock input is split into a root clock input and a sub-domain clock input (206). Those registers/sequential elements that can be identified as primary inputs or primary outputs (204) of the block via the code (i.e. those sequential elements that don't have any combinational logic between their inputs/outputs and the primary inputs/outputs of the block) are assigned to the root clock (203), while all other sequential elements are assigned to the sub-domain clock (204) without regard for the timing offset between the two clocks (assumes 0 offset).

All primary inputs of the block are traced forward to all sequential elements they feed and each sequential element is checked to insure that they are clocked by the root clock. If the sequential element was originally assigned to the sub-domain clock, it is reassigned to the root clock. In a similar fashion, all primary outputs of the block are traced back to their sourcing sequential element and the domain assignment is checked, and reassigned if necessary (203), (204). Cones which contain feedback of primary outputs to internal latches are also examined to insure that they terminate on latches clocked by the sub-domain. This step identifies all sequential elements which form the "latched" boundary of the block whether they are primary I/O or not and insures that all BLOCK-to-BLOCK timings at the next level of synthesis are root-clock-referenced full cycle paths. Should there be input to output paths in the block that are purely combinational, no sequential element will be found in either trace and the path will remain unaffected.

The technology-dependent netlist, post clock-reassignment is examined to identify cones of combinational logic where the source and capture clock domains are different, thus creating a sub-cycle or super-cycle timing requirement for the combinational section (208). All cones identified as sub-cycle or super-cycle are re-synthesized to meet the timings between the root clock and the sub-domain as calculated earlier in the synthesis process. Synthesis for timing optimization is known, however, in this case, it is only operating on specific cones of logic identified in the new synthesis process.

The two new clock trees can be synthesized to meet delay, skew and loading requirements of the system in a known manner, adding buffers as required to drive the differing latch counts evenly. With block synthesis complete, the technology-dependent design can be simulated with the same pattern set used to verify the high-level logic description, adding a new clock domain and timing to stimulate the clock sub-domain, and the logic verified. The result of this synthesis approach is that latches which form the input and output boundaries of a logic block will be clocked with a master clock edge, while all other latches in the block will be offset by a known, designed-in amount. As multiple blocks are stitched together into a larger piece of logic, communication between blocks is guaranteed to be root-clock-referenced and timings will be full-cycle. Assigning each block a different sub-domain offset will create a system where block-to-block, internal latches will not be clocked simultaneously reducing noise (208). In stitching all blocks together, the sixth and last synthesis operation is to create the clock generation circuitry and buffering which feeds multiple logic blocks (210). In this step, the design is examined to identify all root clocks and subdomains, along with their loadings and a central clock generation means is constructed. This may use multi-phase PLLs, tapped delay systems or other means for implementation.

The intra-cycle phase shift operation results in a logic function identical to the pre-shifted block, with the latch-to-latch, input-to-latch and output-to-latch logical function identical to the original design, however, all latches internal to the block are clocked at a different phase point in the cycle compared to the original design. Combining a number of blocks, each with a unique phase offset, into a larger semiconductor will spread the noise generated, and thus reduce peak noise when latches are clocked due to phase separation. It should be noted that in this embodiment, phase shifting results in two sub-cycle segments in the function (input-latch to first-internal-latch, last-internal-latch to Ioutput-latch) which together equate to one clock cycle period, thus, the phase-shifted function output from synthesis operates in N−1 cycles where N is the original clock-latency of the block. In many instances, changes in latency may not be a problem. However should latency reduction pose a problem with interface to other logic blocks, synthesis may be instructed to pad either the input or output side of the block with an additional set of latches to restore the original latency. Latch padding may also be employed should timing-driven-synthesis be unable to compress the input-latch to first-internal-latch logic or last-internal-latch to output-latch logic down to the required sub-cycle.

While the description above is targeted towards a general finite state machine, the synthesis methodology is also applicable to pipelining architectures where latch-to-latch activity is more controlled pre-synthesis.

In an alternate embodiment, synthesis flow occurs in a manner very similar to that described above, however, cycle time requirements for the last-internal-latch to output-latch timing are converted from a sub-cycle requirement where the delay through the logic stage must be less than the clock cycle time minus the internal phase offset to a super-cycle requirement where the delay through the logic stage must be greater than the clock cycle time minus the internal phase offset such that it arrives at the capture latch after the first capture-latch clock edge after its launch, but before the second capture latch clock edge after its launch. In this embodiment, two pieces of data will be in flight in the last stage of the block at any one time and the original latency of the block will be maintained.

Creation of super-cycle timing in the last stage may be accomplished during synthesis using a number of techniques. In the case where last stage logic could have met sub-cycle timings with timing-driven synthesis, last stage logic can be depowered, and buffers added as necessary to insure that latch-to-latch timing requirements are met and no race conditions are present. In cases where last-stage sub-cycle timings could not be met due to a large phase offset in the internal-latch clock, an extra cycle for logic operation is allowed, with appropriate checks to insure that two pieces of data can be in flight in the logic stage and that no race conditions exist. Should a case exist where due to very small phase offset the input-latch to first-internal-latch timings cannot be met, synthesis may be used to shift a portion of the logic in each stage downstream one latency-level, resulting in timing reduction in the input stage to implement the sub-cycle path and increased logic/delay in the output stage to form the super-cycle path. With logic shifting, it will be necessary to add pre-shift to post-shift logic verification steps to the synthesis flow to insure identical functionality post-logic-shift. While the embodiment described above is targeted towards a general finite state machine, the synthesis methodology is also applicable to pipelining architectures where latch-to-latch activity is more controlled pre-synthesis.

In another embodiment, it may be advantageous to target clock partition operation to a higher level of the design, leaving the clock partition decision and architecting to higher level (noise) architects. This also allows "retrofit" of logic blocks coded without clock partition into the new synthesis method and provides a means of top-down synthesis. In this extension, CLKPARTITION statements do not exist in each logic block, but a variant of the CLKPARTITION statement exists at the highest level to be synthesized. The construct is as follows:

```
MODULE HIGHLEVEL ( );
    OUTPUT ........
    INPUT .......
    WIRE ......................................
    HierCLKPARTITION blkdef1 clkroot1 clksubdomaindef1 blkdef2
clkroot2
        clksubdomaindef2........
    HierCLKPARTITIONSTOP stopblkdef1 stopblkdef2 .............
        Call to BLOCK1 with signal/wire connections
        Call to BLOCK2 with signal/wire connections
        Call to BLOCK3 with signal/wire connections
            (Hierarchical block with calls to BLOCK3A, BLOCK3B,
        BLOCK3C)
        .......
        Call to BLOCKN
```

In this embodiment, synthesis operates from the top, where the hierarchical clock partition statements exist, downward. While traveling downward to synthesizable blocks, synthesis uses pre-existing technology-dependent logic already in the netlist, e.g., pre-synthesized logic and synthesizes logic for any block still in technology dependent form. Once initial technology-dependent conversion is complete, the methodology operates with the HierCLKPARTITION and HierCLKPARTITIONSTOP keywords at the top of the hierarchy. The HierCLKPARTITION call defines three arguments for each block to be phase shifted. The first, blkdefx, is the block to perform phase shifting on. The second argument, clkrootx, defines the root clock to be shifted, and the third, clksubdomaindefx, defines the amount of phase shift to provide.

An example shifting a BLOCK1 with a root clock of CLK1 by 30% and BLOCK2 with a rootclock of CLK1 by 40% would be:

HierCLKPARTITION BLOCK1 CLK1 CLK1_0_30 BLOCK2 CLK1 CLK1_0_40

Blocks called out in the HierCLKPARTITION statement need not be top level blocks of the design and calling of block within the HierCLKPARTITION statement does not preclude a lower-hierarchy block within the called block to either be re-assigned to a different phase through its own call in the HierCLKPARTITION statement. An example adding a phase reassignment to subclock BLOCK2_SUB1 with a rootclock of CLK1 by 45% would be HierCLKPARTITION BLOCK1 CLK1 CLK1_0_30 BLOCK2 CLK1 CLK1_0_40 BLOCK2_SUB1 CLK1 CLK1_0_45

The HierCLKPARTITION statement creates additional clock assertions within synthesis, defining new clock domains and its relationship to clocks defined within the primary assertion file input to synthesis. The HierCLKPARTITIONSTOP call defines blocks within the hierarchy that are ignored during the phase shifting operation. Lower hierarchy level blocks within a block called out in the HierCLKPARTITION statement that are to be ignored during clock partitioning/shifting are called out in the list. An example, excluding sub-block BLOCK1_SUB2 from clock partitioning would be:

HierCLKPARTITIONSTOP BLOCK1_SUB2

The CLKPARTITIONSTOP key terminates clock partitioning on encountering the block and any hierarchy under the stop block will not be clock partitioned unless the lower level block is called out in the HierCLKPARTITION statement.

With initial technology dependent synthesis complete and as a first step to hierarchical clock partition synthesis, the design is read in and blocks within the design are mapped with respect to hierarchy and checked against the HierCLKPARTITION and HierCLKPARTITIONSTOP arguments to determine order and extent of processing. With audit complete, clock partition synthesis extends downward. From top down, blocks encountered that do not appear in the HierCLKPARTITION statement are left unchanged (i.e., unpartitioned, root clock only). When a block with a HierCLKPARTITION entry is encountered, all logic blocks under that block which is neither redefined in the HierCLKPARTITION statement nor the HierCLKPARTITIONSTOP statement is treated as a flat entity and shifted in accordance with embodiment 1 or embodiment 2 of the invention. Should lower blocks be encountered with HierCLKPARTITION definitions of their own, these are also processed in accordance with the above embodiments and in accordance with Hierarchical processing to handle any blocks even lower in the hierarchy. Sub blocks within the HierCLKPARTITIONSTOP definition would not be partitioned. Likewise, lower level blocks within a HierCLKPARTITIONSTOP block would not be partitioned unless called out in the HierCLKPARTITION statement, in which case, the same rules for starting and stopping partitions in lower hierarchy apply.

During synthesis, where logic is being "flattened" to form the clock phase domains, defined to different partition domains, or forced to remain in the root domain, boundaries are defined where the root clock latching requirements are enforced, thus for each "flattened" unit, the boundaries of the unit will be clocked with the root clock and the internal sections of the unit will be clocked with the phase sub-domain, such that when blocks with different internal-sub-domains come together, their timing relation is dictated only by the root clock.

An example for a pipeline or pipeline segment in both the Verilog and VHDL languages is shown below as a basis for development of another embodiment of the present invention.

```
MODULE SEQLOGIC(dataout,clocksig datain);
    OUTPUT [n:0] pipereg7
    INPUT clocksig, [n:0] datain
    REG [n:0] pipereg1, pipereg2, pipereg3, pipereg4, pipereg5,
    pipereg6, pipereg7
    WIRE[n:0] combfunc1, combfunc2, combfunc3, combfunc4,
    combfunc5, combfunc6,
```

```
combfunc1 = {Some Combinational logic function of pipereg1}
combfunc2 = {Some Combinational logic function of pipereg2}
combfunc3 = {Some Combinational logic function of pipereg3}
combfunc4 = {Some Combinational logic function of pipereg4}
combfunc5 = {Some Combinational logic function of pipereg5}
combfunc6 = {Some Combinational logic function of pipereg6}
ALWAYS @(POSEDGE clocksig)
BEGIN
    pipereg1 = datain
    pipereg2 = combfunc1
    pipereg3 = combfunc2
    pipereg4 = combfunc3
    pipereg5 = combfunc4
    pipereg6 = combfunc5
    pipereg7 = combfunc6
END
ENDMODULE
```

In a similar fashion, sequential logic blocks within VHDL are formatted as:

```
ENTITY SEQLOGIC IS
    PORT (datain : std_logic_vector
        clksig: std_logic
        pipereg7: std_logic vector);
END SEQLOGIC;
ARCHITECTURE EXAMPLE of SEQLOGIC IS
    SIGNAL combfunc1, combfunc2, combfunc3, combfunc4,
combfunc5, combfunc6 : std_logic_vector
BEGIN
PROCESS
BEGIN
    combfunc1 <= {Some Combinational logic function of pipereg1}
    combfunc2 <= {Some Combinational logic function of pipereg2}
    combfunc3 <= {Some Combinational logic function of pipereg3}
    combfunc4 <= {Some Combinational logic function of pipereg4}
    combfunc5 <= {Some Combinational logic function of pipereg5}
    combfunc6 <= {Some Combinational logic function of pipereg6}
    IF clocksig'EVENT AND clocksig= '1' THEN
        pipereg1 = datain
        pipereg2 = combfunc1
        pipereg3 = combfunc2
        pipereg4 = combfunc3
        pipereg5 = combfunc4
        pipereg6 = combfunc5
        pipereg7 = combfunc6
    END IF;
    WAIT ON clocksig;
END PROCESS
```

Logic blocks targeted for synthesis-driven generation of clock sub-domains are coded similarly to the code shown above; however, high level language extensions, not provided, are used to define clock sub-domains to be used during synthesis. Snippets of example Verilog and VHDL with language extensions are shown below:

```
Verilog With Clock Sub-Domain Extensions
    MODULE SEQLOGIC(dataout,clocksig datain);
        OUTPUT [n:0] pipereg6
        INPUT clocksig, [n:0] datain
        REG [n:0] pipereg1, pipereg2, pipereg3, pipereg4,
        pipereg5, pipereg6
        WIRE[n:0] combfunc1, combfunc2, combfunc3,
    combfunc4, combfunc5, combfunc6
        CLKPARTITION clocksig, clocksig_0_30, clocksig_1_60
        .........
VHDL With Clock Sub-Domain Extensions
    ARCHITECTURE EXAMPLE of SEQLOGIC IS
        SIGNAL combfunc1, combfunc2, combfunc3, combfunc4,
        combfunc5, combfunc6 : std_logic_vector
            CLKPARTITION clocksig, clocksig_0_30, clocksig_1_60
            BEGIN
            PROCESS
            BEGIN
                combfunc1 <= {Some Combinational logic function
                of pipereg1}
            ..........
```

The CLKPARTITION language extension supplies several additional pieces of information to downstream synthesis flows. First, the CLKPARTITION statement itself identifies the logic module or architecture block as a target for clock domain partitioning. Arguments following the CLKPARTITION are defined as follows:

CLKPARTITION arg1, arg2, arg3, arg3 . . . argn

Arg1 defines the root clock for sub-domain partitioning as well as the final clock phase to use at the logic block's input and output register stages arg2 defines the first clock subdomain. Its name is a concatenation of the fields; arg2sub1_arg2sub2_arg2sub3, each imparting information to the synthesis tool on desired clock sub-domain definition. Field arg2sub1 defines the parent clock and phase for the clock sub-domain. Field arg2sub2 defines the number of whole-cycle delays experienced by data traveling from the previous launch register to the capture register. A field of ~0 indicates that the combinational delay between the two registers is less than 1 clock cycle. A field of _1 indicates that the combinational delay between the launch and capture register is greater than one cycle but less than two cycles, such that data launched by clock edge0 will be captured by clock edge 2. Field arg2sub3 defines the within-cycle offset of the sub-domain clock. A code of _30 will place the active edge of the sub-domain clock 30% of the period from the active edge of the master. a code of _60 will place the active edge 60% away from the master edge. Arg3 defines a second clock sub-domain, similar in coding to arg2. Argn defines an Nth clock sub-domain similar in coding to arg2.

Synthesis is instructed to form three clock phases from the clocksig root; a master phase (0 offset), a clock phase delayed 30% of the clock cycle time (clocksig_0_30) and a clock phase delayed by 60% of the clock cycle time (clocksig_1_60). Synthesis is further instructed that combinational logic feeding registers assigned to the clocksig_0_30 domain must have a delay less than the within-cycle launch to capture clock time offset and that combinational logic feeding registers assigned to clocksig_1_60 must have a delay greater than the within-cycle launch to capture clock time offset and less than the launch-to-capture clock time offset +1 cycle such that data launched will not be captured on the first active edge of the capture clock after data launch but will be available for capture at the second active edge (more than one cycle of in-flight data will be between the launch and capture latches of domains where argxsub2 of the two sub-domains is different. The example above will result in a three clock system; a master clock at 0% phase, a first sub-domain at 30% phase and a second sub-domain at 60% phase with the goal of nearly-evenly distributing registers across the three clocks.

The CLKPARTITION statement acts as an additional clock assertion within synthesis, defining a new clock domain and its relationship to a clock defined within the primary assertion file input to synthesis. During behavioral simulation of encoded blocks, the CLKPARTITION statement is ignored and the block is simulated as though it has a single phase clock. Making the CLKPARTITION function transparent to the logic designer simplifies logic design and increases usability of the function. During synthesis, should a block be found that does not contain a CLKPARTITION statement, a single, clock, not assigned to a sub-domain, is assumed and the block is synthesized in a known fashion. If a CLKPARTITION statement is found, it is read, and using the clock period target input to synthesis, timings between various clock edges are calculated and stored.

With CLKPARTITION calculation completed and stored, the logic block is first synthesized in a manner consistent with the present art, with the period as defined to synthesis and a single clock. With a first synthesis complete, a second synthesis is performed. In this synthesis run, the first and last sequential elements t are held to the master clock phase while successive stages of the data pipe, from the second t latch to the N−1th latch are synthesized with clock phases rotating from the first to the last offset, back to the master, and repeating as necessary, fitting the logic delay into the available time between the launching and capturing clock phases through synthesis-for-delay techniques and moving logic from one side of latch boundary to another using logic equivalence. If timing cannot close because of domain-to-domain definitions, especially in the logic cone between the last sub-domain latch and the output latch of the block (which is forced to the master phase), the phase of the last sub-domain register may be swapped out or additional padding registers may be placed to correct timing. In the above example, synthesis fits the registers to the following sub-domains and logic will be forced in the percentage of the timing cycle listed.

| Register | Clock Domain | Timing Constraint |
| --- | --- | --- |
| pipereg1 | clocksig | Not Applicable (receiving latch from off-module, assumed to be < 1 cycle from launching register |
| pipereg2 | clocksig__0__30 | data delay < 30% of master clock cycle |
| pipereg3 | clocksig__1__60 | data delay > 30% of master clock cycle and < 130% of master clock cycle |
| pipereg4 | clocksig | data delay < 40% of master clock cycle |
| pipereg5 | clocksig__0__30 | data delay < 30% of master clock cycle |
| pipereg6 | clocksig__1__60 | data delay > 30% of master clock cycle and < 130% of master clock cycle |
| pipereg7 | clocksig | data delay < 40% of master clock cycle |

With latch timing assigned, and logic resynthesized and/or moved from one side of a register boundary to another to meet timings, clock generation logic is synthesized of instantiated to create the required clock phase shifts within the block (as an alternative, the multiple phase clocks may be left as idealized and added as input ports to the block for later synthesis at a higher level, synthesized for buffering only such that clock tree generation can be done at a higher integration level and shared, or some hybrid of the above embodiments.

With clock assignment, logic re-synthesis and clock tree build complete, the result of the original synthesis is simulated through a Boolean equivalence program in parallel with the final sub-domain version of the block to verify equivalence. Simulation is conducted using timing estimates for the logic system. Patterns used may identical to those used in pre-synthesis logic verification, automatically generated Boolean combinations, or some combination thereof. The comparison step guarantees that the final block, with altered logic partitioning between latches and sub-domain clocks is equivalent to the intent of the function. Alternatively, initial synthesis is only used for initial logic generation and latch placement, and not used for Boolean equivalence simulation. In these cases, the behavioral logic model is used to verify the final synthesis.

In another embodiment of the synthesis flow, logic blocks may be coded with a single clock, omitting the CLKPARTITION extension, and the CLKPARTITION extension may be applied globally to a clock at the top of the design. In this case, the CLKPARTITION coding may operate moving the phase of one lower level block relative to another, or may resynthesize into lower level blocks unless CLKPARTITION is disabled at lower-block level. In yet another embodiment, each block is coded with a CLKPARTITION statement which contains the root clock and a single clock sub-domain (arg2). In this embodiment, arg2sub2 is limited to "0" such that combinational delay between launching root clock and a capturing clock sub-domain is constrained to less than one cycle. Within the clock sub-domain definition arg2sub3 may be explicitly defined, or set to a variable (unique for each block to be synthesized in a synthesis run) and assigned at the top level of design to be synthesized. As an objective, arg2sub3 should be unique for each synthesized block in the design.

During synthesis, each block is synthesized with a single root clock and a single clock sub-domain. Latches which form the block boundary are assigned the root clock whereas all latches internal to the block are assigned the clock sub-domain. This topology insures that the block-to-block timing constraints are always full cycle, as are the majority of latch-to-latch timings within the block. Because of the sub-domain definition, the timing between the latch at the input boundary (e.g., root clock) and the first internal latch (e.g., clock sub-domain) will be sub-cycle, as will the timing between the last internal latch (e.g., clock sub-domain) and the output boundary (e.g., root clock). With the target performance defined to synthesis and the root clock-to-clock sub-domain separation defined by the CLKPARTITION statement, the boundary to first internal latch and last internal latch to boundary logic cones may be synthesized to meet the tighter delay requirements imposed by the clock offset. At synthesis completion, the block (or blocks) synthesized contain a root clock tree as well as a clock sub-domain tree. At top level chip integration, all block-level root clock and clock sub-domain inputs are sourced by a central clock generation unit which may be based on a multi-phase PLL. The resulting design spreads latch switching across the cycle with latches within each functional block being clocked at a different point within the cycle, and block-to-block communication guaranteed by full-cycle timings provided by enforcement of boundary latch coding with the root clock.

More particularly, for multi-phase rotation with sub-cycle and super-cycle generation in a pipeline where code which does not implement the shifting function exists or phase-rotation capability is desired at the multi-block level, a method, similar method may be used to perform clock phase assignments and targeting.

Figure 12:
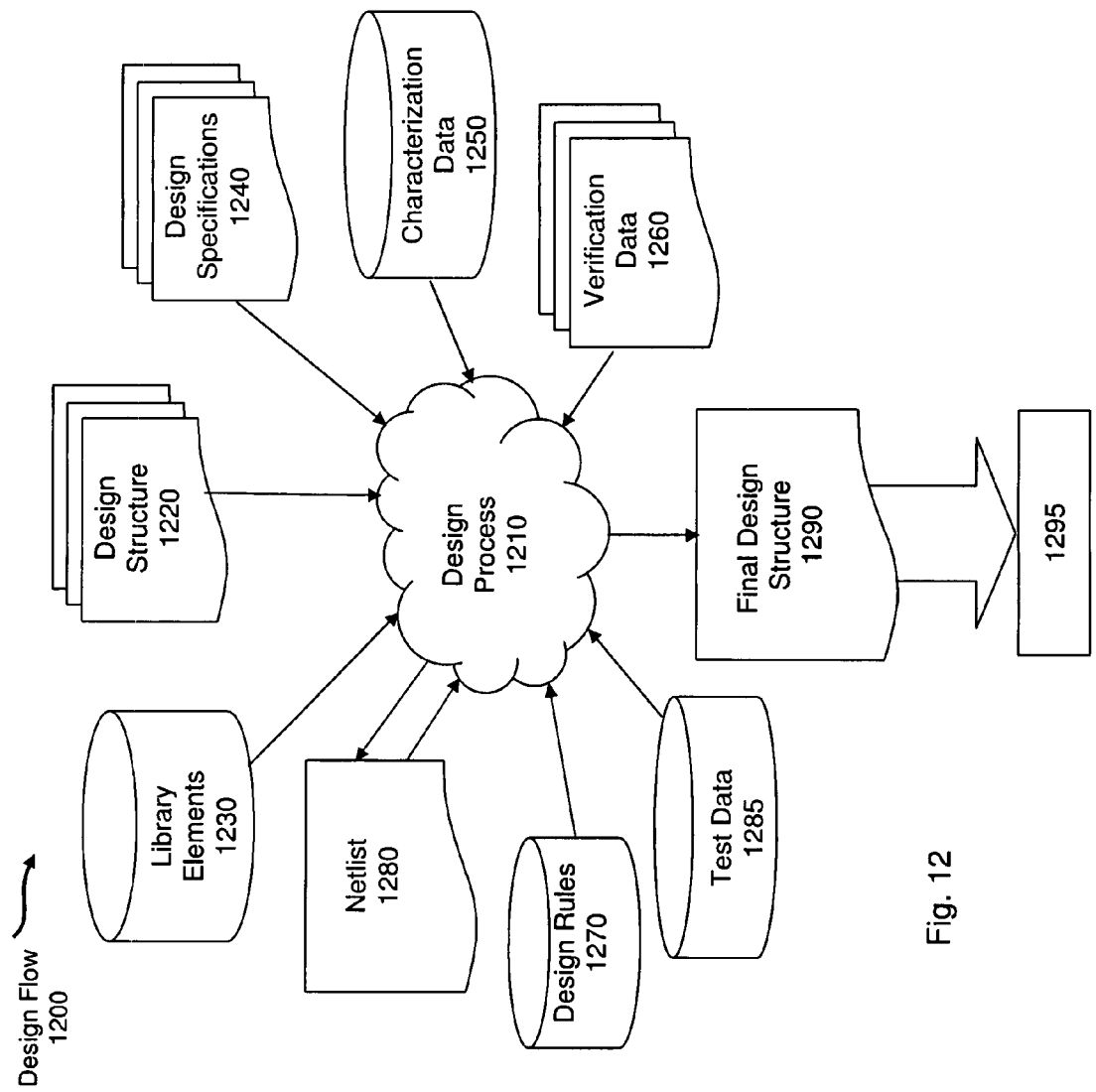
FIG. 12 is a flow diagram of a design process used in semiconductor design, manufacturing, and/or test.

FIG. 12 shows a block diagram of an example design flow 1200. Design flow 1200 may vary depending on the type of IC being designed. For example, a design flow 1200 for building an application specific IC (ASIC) may differ from a design flow 1200 for designing a standard component. Design structure 1220 is preferably an input to a design process 1210 and may come from an IP provider, a core developer, or other design company or may be generated by the operator of the design flow, or from other sources. Design structure 1220 comprise the circuit 10-13 in the form of schematics or HDL, a hardware-description language (e.g., Verilog, VHDL, C, etc.). Design structure 1220 may be contained on one or more machine readable medium. For example, design structure 1220 may be a text file or a graphical representation of the circuit 10-13. Design process 1210 preferably synthesizes (or translates) the circuit 10-13 into a netlist 1280, where netlist 1280 is, for example, a list of wires, transistors, logic gates, control circuits, I/O, models, etc. that describes the connections to other elements and circuits in an integrated circuit design and recorded on at least one of machine readable medium. This may be an iterative process in which netlist 1280 is resynthesized one or more times depending on design specifications and parameters for the circuit.

Design process 1210 may include using a variety of inputs; for example, inputs from library elements 1230 which may house a set of commonly used elements, circuits, and devices, including models, layouts, and symbolic representations, for a given manufacturing technology (e.g., different technology nodes, 32 nm, 45 nm, 90 nm, etc.), design specifications 1240, characterization data 1250, verification data 1260, design rules 1270, and test data files 1285 (which may include test patterns and other testing information). Design process 1210 may further include, for example, standard circuit design processes such as timing analysis, verification, design rule checking, place and route operations, etc. One of ordinary skill in the art of integrated circuit design can appreciate the extent of possible electronic design automation tools and applications used in design process 1210 without deviating from the scope and spirit of the invention. The design structure of the invention is not limited to any specific design flow.

Design process 1210 preferably translates an embodiment of the invention as shown in FIG. 12, along with any additional integrated circuit design or data (if applicable), into a second design structure 1290. Design structure 1290 resides on a storage medium in a data format used for the exchange of layout data of integrated circuit 10-13 (e.g., information stored in a GDSII (GDS2), GLI, OASIS, or any other suitable format for storing such design structures). Design structure 1290 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 12. Design structure 1290 may then proceed to a stage 1295 where, for example, design structure 1290: proceeds to tape-out, is released to manufacturing, is released to a mask house, is sent to another design house, is sent back to the customer, etc.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A design structure embodied in a machine readable non-transient medium used in a design process, the design structure comprising a system for noise reduction in an electrical circuit comprising:
   a synthesizer to synthesize blocks comprising sequential elements in said electrical circuit;
   a generator to operate on said sequential elements to generate a root clock signal and at least one phase-shifted sub-domain clock signal for each of said blocks;
   a first assignment unit to act on said blocks adapted to assign primary inputs and primary outputs of said block to said root clock signal;
   a second assignment unit to act on said blocks to assign non-primary inputs and non-primary outputs of said block assigned to said phase-shifted sub-domain clock signal; and
   an allocator connected to said generator to allocate said blocks comprising different phase-shifted sub-domain clock signals.

2. The design structure according to claim 1, wherein said sequential elements comprise boundary elements and internal latches and wherein said boundary latches mark the boundaries of said blocks.

3. The design structure according to claim 2, wherein said internal latches comprises said non-primary inputs and said non-primary outputs.

4. The design structure according to claim 2, wherein said boundary latches comprise said primary inputs and said primary outputs.

5. The design structure according to claim 2, further comprising a controller connected to blocks to control said boundary latches by said root clock signal.

6. The design structure according to claim 2, further comprising a controller connected to blocks to control said internal latches by said sub-domain clock signal.

7. The design structure according to claim 1, wherein said design structure comprises a netlist which describes a circuit.

8. The design structure according to claim 1, wherein said design structure resides on a storage non-transient medium as a data format used for the exchange of layout data of integrated circuits.

9. The design structure according to claim 1, wherein said design structure includes at least one of test data files, characterization data, verification data, and design specifications.

10. A design structure embodied in a machine readable non-transient medium used in a design process, the design structure comprising a system for noise reduction in an electrical circuit comprising:
    a synthesizer to synthesize blocks comprising sequential elements in said electrical circuit;
    a generator to operate on said sequential elements to generate a root clock signal and at least one phase-shifted sub-domain clock signal for each of said blocks;
    a first assignment unit to act on said blocks to assign primary inputs and primary outputs of said block to said root clock signal;
    a second assignment unit to act on said blocks to assign non-primary inputs and non-primary outputs of said block assigned to said phase-shifted sub-domain clock signal;
    an allocator connected to said generator to allocate said blocks comprising different phase-shifted sub-domain clock signals, and
    wherein said sequential elements comprise boundary latches and internal latches and wherein said boundary latches mark the boundaries of said blocks.

11. The design structure according to claim 10, wherein said internal latches comprises said non-primary inputs and said non-primary outputs.

12. The design structure according to claim 10, wherein said boundary latches comprise said primary inputs and said primary outputs.

13. The design structure according to claim 10, further comprising a controller connected to blocks to control said boundary latches by said root clock signal.

14. The design structure according to claim 10, wherein said design structure comprises a netlist which describes a circuit.

15. The design structure according to claim 10, wherein said design structure resides on a storage non-transient medium as a data format used for the exchange of layout data of integrated circuits.

16. The design structure according to claim 10, wherein said design structure includes at least one of test data files, characterization data, verification data, and design specifications.

17. A design structure embodied in a machine readable non-transient medium used in a design process, the design structure comprising a system for noise reduction in an electrical circuit comprising:
- a synthesizer to synthesize blocks comprising sequential elements in said electrical circuit, wherein said sequential elements comprise boundary latches and wherein said boundary latches mark the boundaries of said blocks;
- a generator to operate on said sequential elements to generate a root clock signal and at least one phase-shifted sub-domain clock signal for each of said blocks;
- a first assignment unit to act on said blocks to assign primary inputs and primary outputs of said block to said root clock signal;
- a second assignment unit to act on said blocks to assign non-primary inputs and non-primary outputs of said block assigned to said phase-shifted sub-domain clock signal;
- an allocator connected to said generator to allocate said blocks comprising different phase-shifted sub-domain clock signals; and
- a controller connected to blocks to control said boundary latches by said root clock signal.

18. The design structure according to claim 17, wherein said design structure comprises a netlist which describes a circuit.

19. The design structure according to claim 17, wherein said design structure resides on a storage non-transient medium as a data format used for the exchange of layout data of integrated circuits.

20. The design structure according to claim 17, wherein said design structure includes at least one of test data files, characterization data, verification data, and design specifications.

* * * * *